(12) United States Patent
Stirling et al.

(10) Patent No.: US 8,843,807 B1
(45) Date of Patent: Sep. 23, 2014

(54) CIRCULAR PIPELINE PROCESSING SYSTEM

(75) Inventors: Colin Stirling, Edinburgh (GB); David I. Lawrie, Lauder (GB); David Andrews, Falkirk (GB)

(73) Assignee: Xilinx, Inc., San Jose, CA (US)

( * ) Notice: Subject to any disclaimer, the term of this patent is extended or adjusted under 35 U.S.C. 154(b) by 436 days.

(21) Appl. No.: 13/212,997

(22) Filed: Aug. 18, 2011

Related U.S. Application Data

(63) Continuation-in-part of application No. 13/088,303, filed on Apr. 15, 2011.

(51) Int. Cl.
| | |
|---|---|
| *H03M 13/00* | (2006.01) |
| *H03M 13/03* | (2006.01) |
| *H03M 13/41* | (2006.01) |

(52) U.S. Cl.
  CPC ............................ *H03M 13/4107* (2013.01)
  USPC .......................................... 714/774; 714/795

(58) Field of Classification Search
  CPC ................... H03M 13/2957; H03M 13/1555; H03M 13/1145; H04L 1/005; H04L 45/7453; G06F 13/1673; G06F 9/3867; G11C 8/10
  USPC ................... 714/774, 755, 795; 375/262, 341
  See application file for complete search history.

(56) References Cited

U.S. PATENT DOCUMENTS

| | | | |
|---|---|---|---|
| 7,100,101 B1 * | 8/2006 | Hemphill et al. | 714/755 |
| 7,266,757 B1 | 9/2007 | Mazahreh et al. | |
| 7,810,010 B1 | 10/2010 | Lawrie | |
| 8,332,735 B1 * | 12/2012 | Andrews et al. | 714/795 |
| 2002/0021763 A1 | 2/2002 | Le Dantec | |
| 2002/0124227 A1 | 9/2002 | Nguyen | |
| 2004/0153942 A1 | 8/2004 | Shtutman et al. | |
| 2004/0210812 A1 | 10/2004 | Cameron et al. | |
| 2005/0273687 A1 | 12/2005 | Park et al. | |
| 2008/0043878 A1 | 2/2008 | Cameron et al. | |
| 2011/0161782 A1 | 6/2011 | Engin | |
| 2012/0106683 A1 | 5/2012 | Zhao | |

OTHER PUBLICATIONS

U.S. Appl. No. 13/088,303, filed Apr. 15, 2011, Colin Stirling et al., Xilinx, Inc., 2100 Logic Drive, San Jose, CA.

* cited by examiner

*Primary Examiner* — Phung M Chung

(57) ABSTRACT

In one embodiment, a circular pipeline processing system is provided. The system includes a plurality of processing stages configured to operate in a circular pipeline. Each processing stage is configured to output a fully processed data block in response to completing a final processing iteration, and otherwise, store a partially processed data block in a memory buffer of the processing stage. Each processing stage is configured to select between an unprocessed data block and a partially processed data block from the memory buffer of a preceding processing stage, based on one or more of availability of memory sufficient for storage of an unprocessed data block or availability of a partially processed data block. The processing stage is configured to process the selected data block.

17 Claims, 10 Drawing Sheets

CIRCULAR PIPELINE PROCESSING SYSTEM

CROSS-REFERENCE TO RELATED APPLICATION

This application is a continuation-in-part of U.S. Patent Application having the application Ser. No. 13/088,303 filed on Apr. 15, 2011 and titled "PIPELINED TURBO CONVOLUTION CODE DECODER" by Colin Stirling, David I. Lawrie, and David Andrews.

FIELD OF THE INVENTION

One or more embodiments generally relate to circular pipeline processing systems and other embodiments relate to decoders.

BACKGROUND

Evolved High-Speed Packet Access (HSPA+) is a wireless standard defined in 3GPP release 7. This standard is set for wide adoption across existing infrastructure currently based on High Speed Download Packet Access (HSDPA) to offer users extended bandwidth prior to the rollout of 3GPP Long Term Evolution (LTE). The HSPA+ standard potentially increases bandwidth more than 10-fold, from 14.4 Mbits/s up to 168 Mbits/s, which will significantly increase the associated processing burdens within the system. This burden is most prevalent in Turbo Convolution Code (TCC) decoders, which are one of the most computationally intensive aspects of the HSPA+ system.

LTE uses a specially designed contention-free interleaver. This allows a large block of data to be partitioned into smaller segments, which can be processed in parallel without multiple processing units contending for access to the same data segment. In contrast, processing algorithms such as TCC decoding for the 3GPP HSPA+ standard do not provide a contention-free interleaver. Dividing data blocks across multiple processing units is extremely difficult because multiple processing units may require access to data from the same memory at the same time creating contention. As a result, it is difficult to implement TCC using a parallel architecture.

In algorithms such as the Turbo Convolution Code (TCC) decoding, the burden placed on the processing unit (PU) is great in terms of computational intensity and resource requirements. In order to produce an efficient solution, the throughput of the processing unit must be maximized, and therefore, utilization of the processing unit should be as near to 100% as possible. These algorithms process each block for a certain number of iterations, typically in the range of 5 to 7 iterations. Each iteration consists of two half-iterations, which are referred to as SISOs (Soft-Input Soft-Output). One of the half-iterations performs SISO operations in an interleaved order while the other half-iteration performs SISO operations in a non-interleaved order. While the half-iterations may be performed in either order, for ease of explanation, the examples and embodiments are primarily described herein with reference to an iteration in which interleaved SISO operations are performed followed by non-interleaved SISO operations.

At the end of each SISO, there will be a significant number of clock cycles required to empty pipelines and finish write back of the so-called extrinsic data, which is exchanged between consecutive SISO operations. The next SISO operation is therefore unable to start until the write back of the extrinsic data has completed. The extrinsic data from the preceding SISO is combined with the original input data for the next SISO operation.

Consequently, if one processing unit is used to perform consecutive SISO operations of a data-block, there will be a delay. As a result, the processing unit will not be utilized in this time period. For example, FIG. 1 illustrates latency incurred in processing successive SISO operations on a data block by the same processing unit. The idle cycles 130 (shown with hatched lines) are incurred between each SISO operation of data block B1 during write back of extrinsic data. In order to fully utilize a processing unit, two data blocks, which can be iteratively processed in turn, are required to avoid the delay incurred during write back. FIG. 2 illustrates alternating processing of two data blocks B1 and B2 on a processing unit for two decoding iterations (four SISO operations). After SISO processing of data block B1 by the processing unit is completed, extrinsic data must be written back to memory. During the write back time period, because data block B2 is not dependent on the extrinsic data of data block B1, the processing unit can begin a SISO operation of data block B2. In this manner, the idle processing time 130 depicted in FIG. 1 can be avoided and throughput can be increased.

To accelerate block-based processing algorithms, such as TCC decoding, a plurality of the processing units may be used to process data blocks in parallel. One possible architecture avoids idle cycles, as shown in FIG. 2, by buffering two blocks for each one of the plurality of processing units. However, this architecture does not scale well by adding processing units because the overall storage requirement is equal to 2 times the maximum block size for each processing unit in the system.

The memory requirement is further increased because an input buffer must be capable of supplying multiple blocks to all processing units in parallel. This situation may occur when processing of data blocks simultaneously completes on all processing units. Because the size of blocks typically varies from 40 to 5114 bytes in HSPA+, this solution may result in large discrepancies in the processing time required. For example, where two smaller blocks are being processed alternately on a processing unit, each processing stage will be completed in far less time than where two large blocks are being processed. As demands on throughput for solutions to algorithms such as TCC decoding for the 3GPP HSPA+ standard extend to 100-200 Mbps, such solutions are impractical as the number of processing units required will typically be in the range of 4-8, creating memory demands that are impractical in most platforms/devices.

SUMMARY

In one embodiment, a circular pipeline processing system is provided. The system includes a plurality of processing stages. Each processing stage includes a memory buffer and at least one processing circuit configured to perform one processing iteration on a first block of data. The plurality of processing stages is configured to operate in a circular pipeline of identical processing stages. Each processing stage is configured to output a fully processed data block in response to completing a final processing iteration, and otherwise, store a partially processed data block in the memory buffer of the processing stage. Each processing stage is configured to select between an unprocessed data block and a partially processed data block from the memory buffer of a preceding processing stage, based on one or more of availability of memory sufficient for storage of an unprocessed data block or availability of a partially processed data block. The processing stage is configured to process the selected data block.

In another embodiment, a decoder is provided. The decoder includes a circular pipeline of processing units arranged in N processing stages. Each processing stage of the circular pipeline includes first and second memory units and first and second processing units. The first memory unit is configured to receive and store data blocks input to the processing stage. The first processing unit is coupled to the first memory unit and is configured to perform a first set of soft-input-soft-output (SISO) decoding operations on a block of data retrieved from the first memory unit to produce an intermediate block of data. The second memory unit is coupled to the first processing unit and is configured to receive and store the intermediate block of data. The second processing unit is coupled to the second memory unit and is configured to perform a second set of SISO decoding operations using the intermediate block of data, retrieved from the second memory unit, to complete one decoding iteration.

In yet another embodiment, a decoder is provided. The decoder includes a memory arrangement configured for storage of a plurality of data blocks in a plurality of memory units, and a circular pipeline having a plurality of processing stages. Each processing stage includes first and second processing units. The first processing unit is coupled to the memory arrangement and is configured to perform a first set of soft-input-soft-output (SISO) decoding operations on a block of data retrieved from one of the plurality of memory units to produce an intermediate block of data, and store the intermediate block of data in the one memory unit. The second processing unit is coupled to the memory arrangement and is configured to perform a second set of SISO decoding operations using the intermediate block of data retrieved from the one memory unit to complete one decoding iteration. The second processing unit is further configured to output a decoded data block in response to completing a final processing iteration, and otherwise, store a partially decoded data block in the one memory unit. The first processing unit is further configured to process a new block of data of the plurality of data blocks retrieved from another one of the memory units in response to a partially decoded data block from a second processing unit of a preceding processing stage in the circular pipeline being unavailable in the memory arrangement.

It will be appreciated that various other embodiments are set forth in the Detailed Description and Claims, which follow.

BRIEF DESCRIPTION OF THE DRAWINGS

Various aspects and advantages of the embodiments will become apparent upon review of the following detailed description and upon reference to the drawings in which.

DETAILED DESCRIPTION OF THE DRAWINGS

One or more embodiments implement high-throughput parallel processing with reduced memory requirements by performing consecutive half iterations of each data block on different processing units in a pipeline fashion, rather than performing all iterations of a data block on the same processing unit. Using this architecture, a data block does not need to be physically divided for TCC decoding, which allows use of either contention free or non-contention free interleavers while avoiding idle processing cycles.

While the embodiments may be applicable to a number of block based processing algorithms, for ease of explanation, the embodiments and examples herein are described primarily with reference to the TCC decoding for HSPA+. The processing units are configured and arranged in a circular pipeline, where the first SISO operation on a data block will start at a specific processing unit in the pipeline, and ensuing SISO operations on the block are performed on downstream processing units in the pipeline. Once all SISO operations are completed, the block will exit the circular pipeline from the processing unit that completes the final SISO operation.

Figure 1:
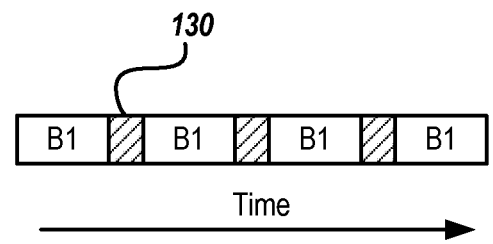
FIG. 1 illustrates latency incurred in processing successive soft-input/soft-output (SISO) operations on a data block by the same processing unit.
Figure 2:
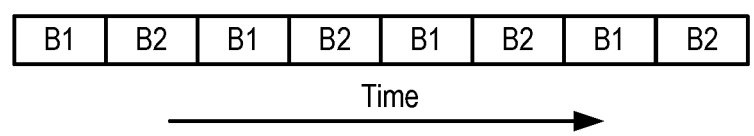
FIG. 2 illustrates alternating processing of two data blocks B1 and B2 on a processing unit for two decoding iterations.
Figure 3:
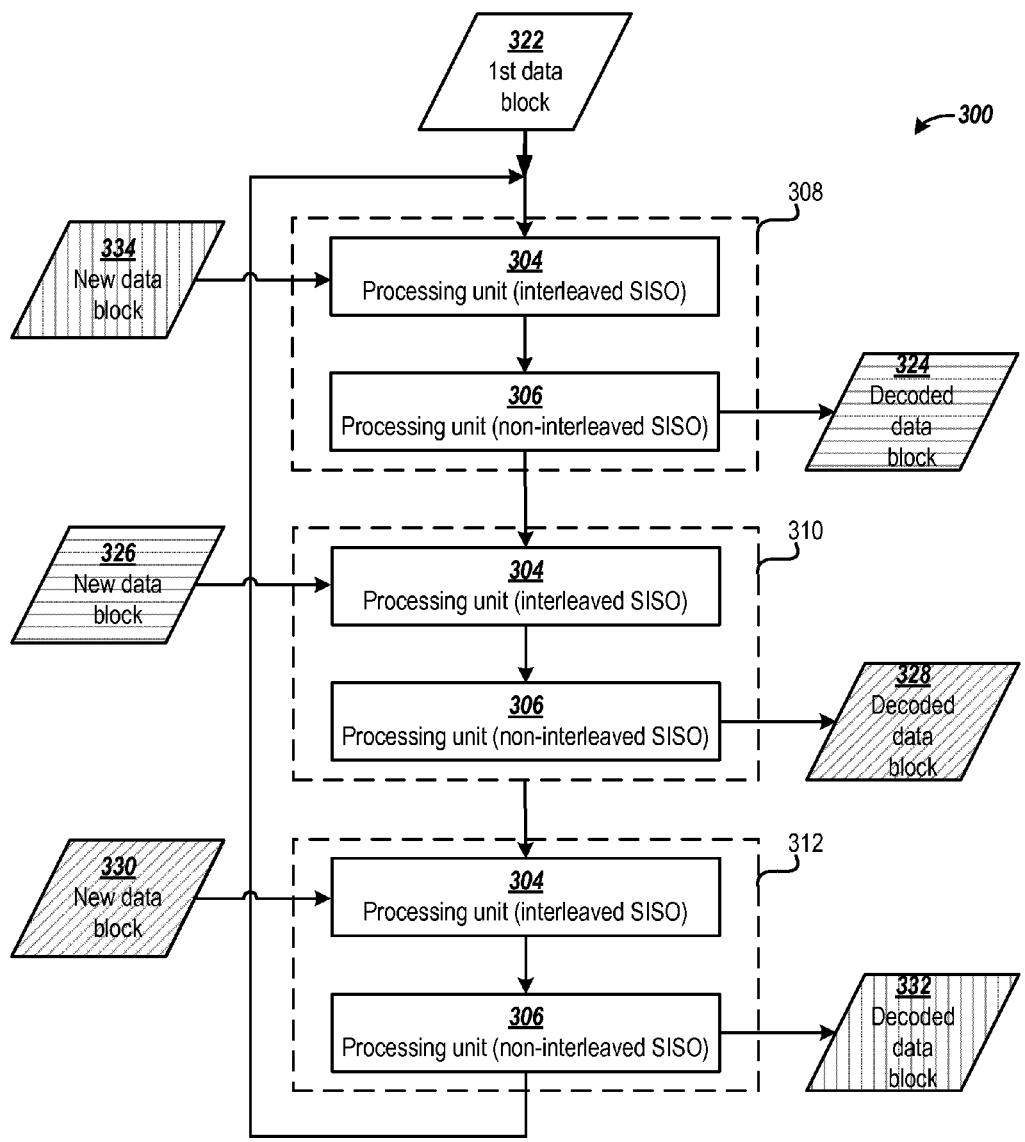
FIG. 3 illustrates the data flow in an example circular pipeline configured for parallel processing of block data.

FIG. 3 illustrates the data flow in an example circular pipeline configured for parallel processing of block data. The circular pipeline 300 includes three processing stages 308, 310, and 312. Each processing stage includes two processing units 304 and 306 for performing SISO operations. A first data block 322 is input to processing stage 308, which performs a first decoding iteration on the data block. For each subsequent decoding iteration, the partially decoded data block is input to and processed by the next processing stage in the pipeline. For example, the second decoding iteration of data block 322 would be performed by processing stage 310, the third decoding iteration would be performed by processing stage 312, the fourth decoding iteration would be performed by processing stage 308, and so on, until decoding is completed.

When decoding is completed by a processing unit, a new data block may be input to the next processing stage in the pipeline. For example, if decoding is completed by processing unit 306 of stage 308, the decoded data block 324 may be output, and new data block 326 may be input to processing unit 304 in processing stage 310. Similarly, if decoding is completed in processing stage 310, decoded data block 328 is output and new data block 330 is input to processing unit 304 in processing stage 312. Decoded data block 332 shows the completion of decoding by processing unit 306 of stage 312. As a result, new data block 334 can be input to processing unit 304 of stage 308 for processing.

Processing units may be implemented differently for different applications and may exhibit different latency and throughput performance. In many implementations, each processing unit may be implemented in a pipelined manner—allowing processing of a data block to begin before processing of a previous data block by the processing unit has completed. In such an implementation, the throughput of a processing unit, in data blocks/unit time, is dictated by the processing rate (x data samples/unit time) of the processing unit and the number of samples included in each data block. For ease of explanation, the data block input time is used herein to refer to the minimum number of cycles required to input the entire data block to the processing unit. The latency between a sample of a data block being input and the corresponding processed sample being output is referred to as the pipeline delay.

It is recognized that the pipelined nature of the processing unit does not prevent continuous input of blocks without any delay between them. Because successive decoding iterations are performed using different processing stages, a processing unit need only have had the data block input for processing in its entirety before the next data block can be input. The processing unit need not wait to have completed writeback or completed SISO processing of the data block before initiating processing of the next block.

Figure 4:
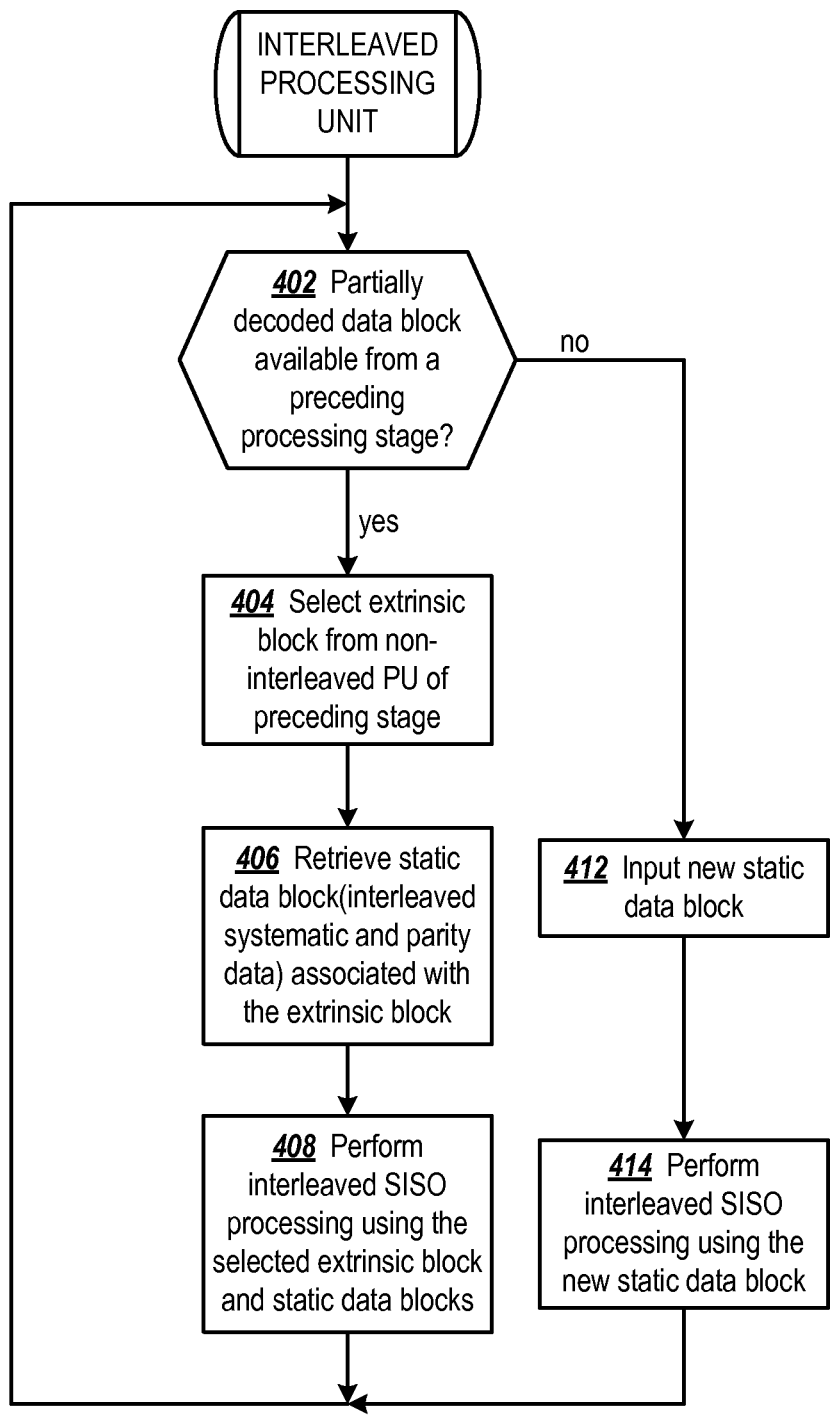
FIG. 4 shows a flowchart of the general process performed by an example interleaved SISO processing unit.

FIG. 4 shows a flowchart of the general process performed by an example interleaved SISO processing unit. If a partially decoded data block is unavailable from a preceding processing stage in the circular pipeline at decision block 402, a new data block is input to the interleaved processing unit at block 412. Interleaved SISO operations are performed using the new data at block 414. Otherwise, the extrinsic data block from the non-interleaved processing unit of the preceding stage is selected as input at block 404 for processing. Static data block sets associated with the extrinsic block are retrieved from memory at block 406. Interleaved SISO operations are performed using the selected extrinsic and static data at block 408.

Figure 5:
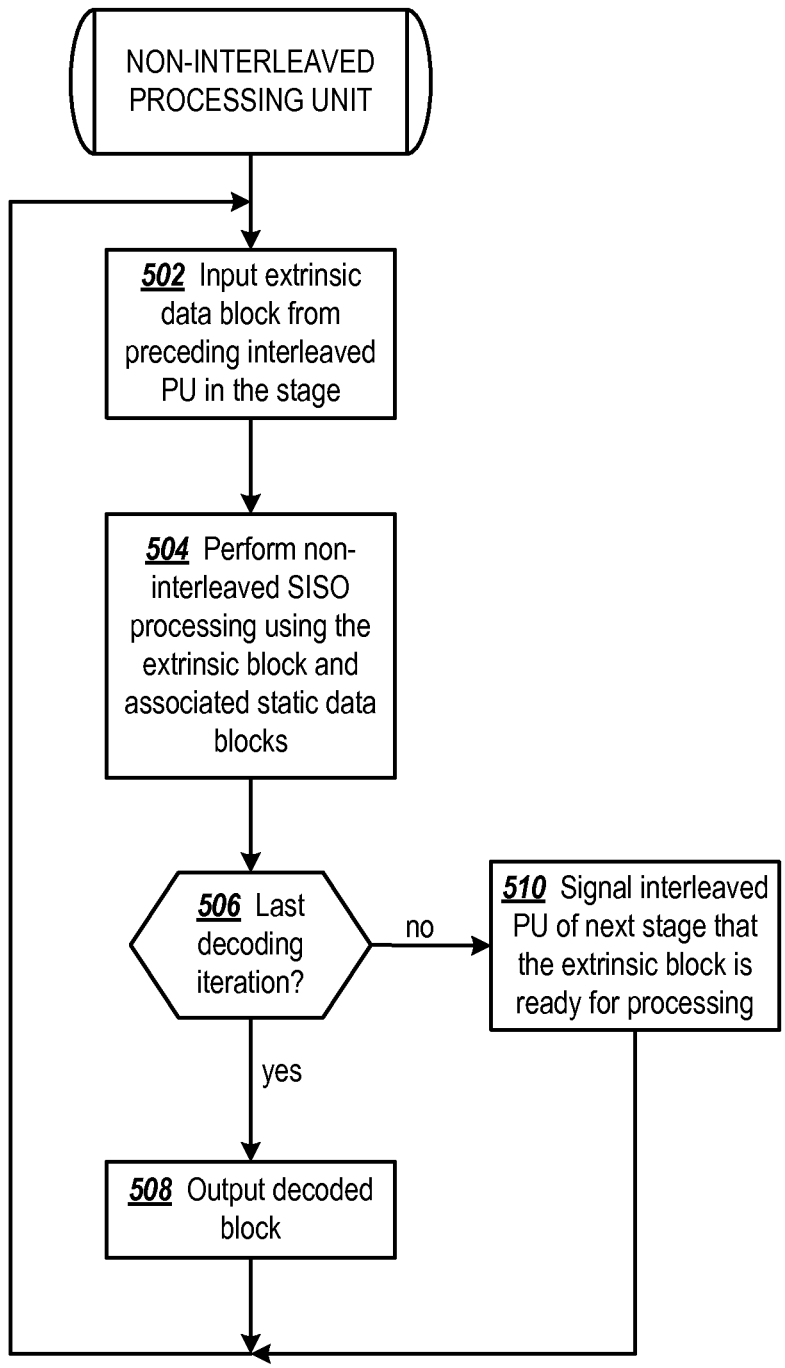
FIG. 5 shows a flowchart of the general process performed by an example non-interleaved SISO processing unit.

FIG. 5 shows a flowchart of the general process performed by an example non-interleaved SISO processing unit. Extrinsic data produced by the preceding interleaved processing unit in the processing stage are input at block 502. A non-interleaved SISO operation is performed using the extrinsic data block and associated static data block at processing block 504. If the SISO operation completes decoding of the data block at decision block 506, the decoded data block is output at block 508. Otherwise, the interleaved processing unit of the next processing stage is signalled at block 510 to indicate that the extrinsic data block is ready for another decoding iteration.

The dataflow shown in FIGS. 4 and 5 illustrate an implementation in which the interleaved SISO operation is performed first followed by the non-interleaved SISO operation. It is recognized that a processing stage may alternatively be configured to perform the non-interleaved SISO operation followed by the interleaved SISO operation.

Figure 6:
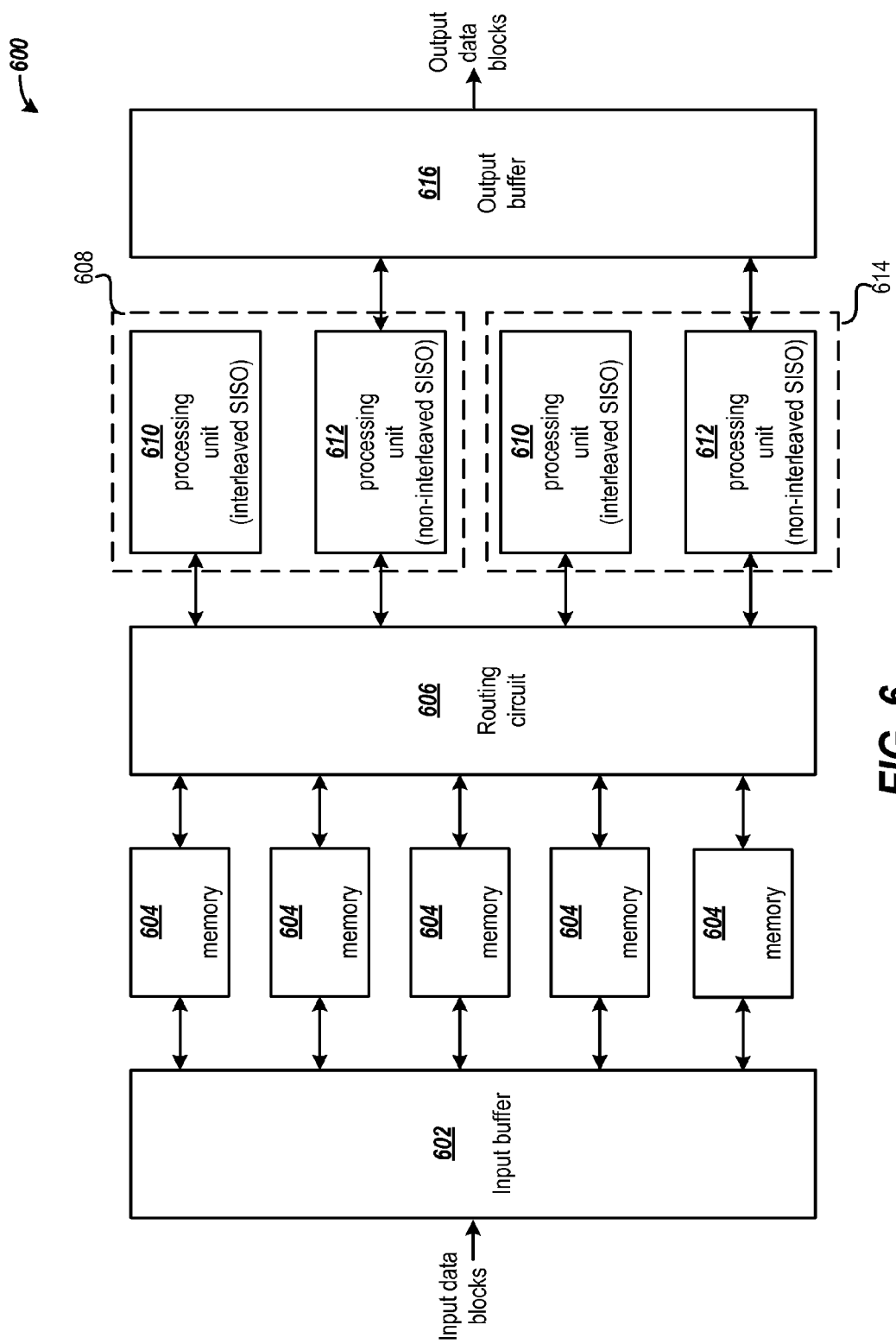
FIG. 6 shows an example circuit implementing a circular pipelined decoder with a centralized memory architecture.
Figure 7:
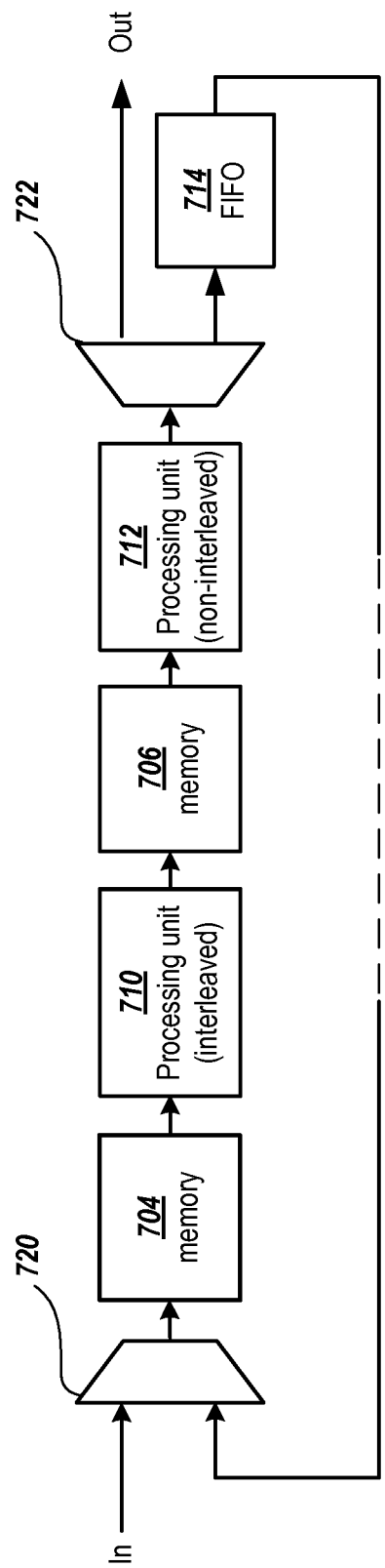
FIG. 7 shows a circular pipeline decoder having one processing stage implemented with a distributed memory architecture.
Figure 8:
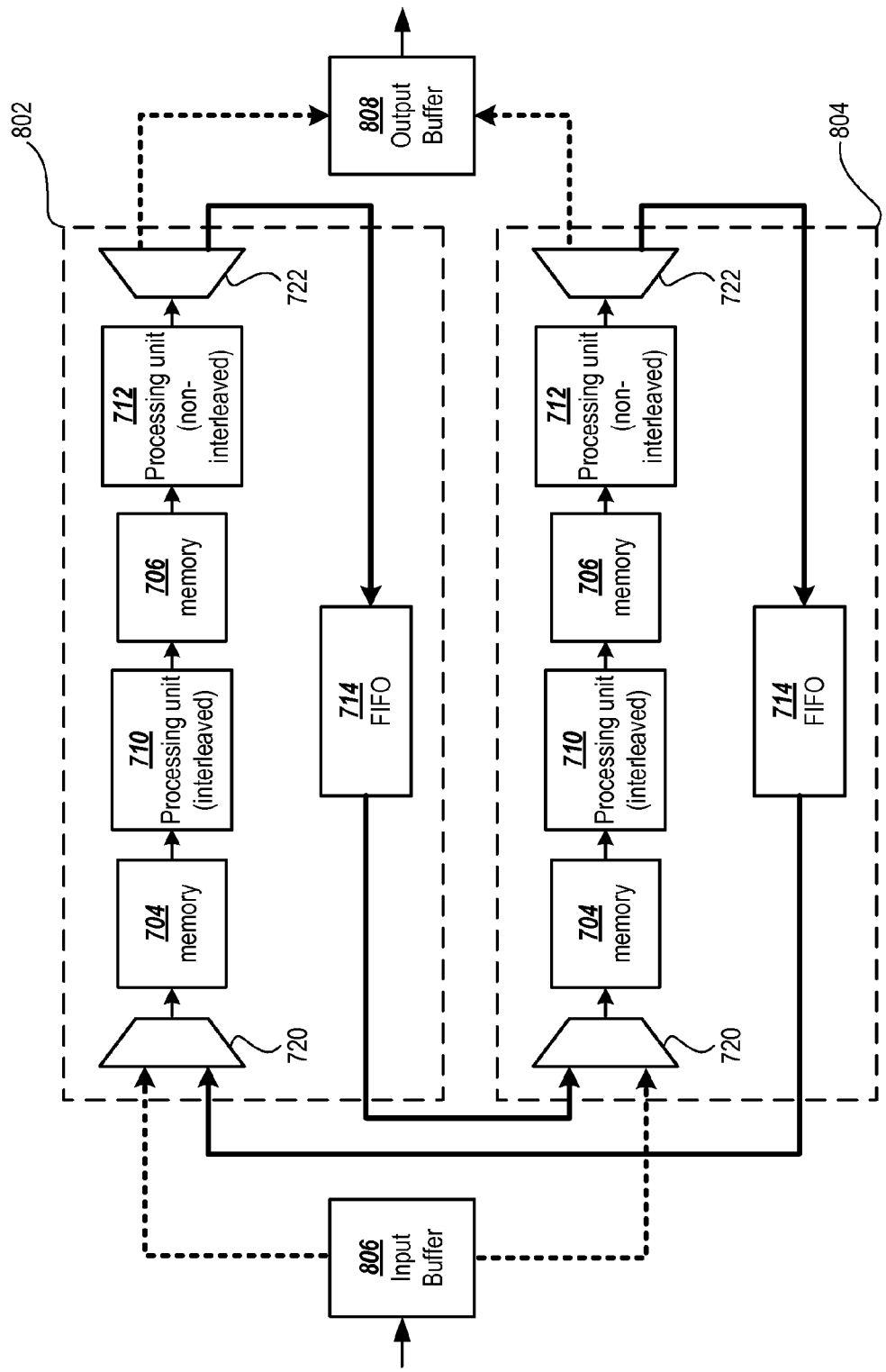
FIG. 8 shows a two-stage circular pipeline decoder implemented with a distributed memory architecture as shown in FIG. 7.

FIGS. 6-8 show example circuit implementations to implement a circular pipelined decoder with centralized and decentralized memory architectures, respectively. FIG. 6 shows an example circuit 600 implementing a circular pipelined decoder with a centralized memory architecture. The circuit includes an input buffer 602, a plurality of processing units 610 and 612, a plurality of memory units 604 for storage of data blocks during processing, and an output buffer 616. For ease of explanation, this example illustration includes two processing stages 608 and 614, each processing stage including a processing unit 610 for performing an interleaved SISO operation and a processing unit 612 for performing a non-interleaved SISO operation.

Each memory unit 604 only has enough memory to contain one maximum sized block. As described above, five full-size blocks are required to avoid idle cycles with four processing units. During operation, memory units 604 are used to store successive data blocks as they are input to the system from the input buffer 602. As described above, each input data block is processed by several processing units over several iterations. As a data block is processed in the circular pipeline, the data block does not move from one memory unit to another. Rather the processing units 610 and 612 in stages 608 and 614 access the same memory unit at different times for processing the data block. The switch 606 provides access to the data blocks in the memory units 604 for the processing units.

In one implementation, each data block may be statically stored in a specified one of the memory units 604 for the duration of the processing iterations. Each SISO operation will consist of reading the block data from the RAM, processing it within a processing unit and then writing the resulting data back to the same memory area for the next processing stage. In this implementation, the switch is configured to map the appropriate processing unit 610 and 612 to the specified memory unit 604 for each SISO operation.

In another implementation, the switch may be configured to dynamically map processing units 610 and 612 to various available memory units 604 as required during the decoding iterations. For example, the memory units may be implemented by one large block of memory, with a respective base memory address corresponding to each memory unit. A data block written into the memory may be written to the next memory location and indexed by the processing unit from which the data was produced. In such an implementation of memory, a data block may be written to different physical memory locations after various decoding iterations. These example implementations of memory units are intended for illustration and not limitation. Other various implementations of memory and addressing are envisioned as well.

In either implementation, when the processing is complete, the results are passed onto the output buffer 616. As described above, decoding of data blocks may be completed by either one of the processing stages 608 and 614 depending on the number of decoding iterations required to complete decoding. The output buffer 616 is configured to output data blocks from the correct processing stages as decoding is completed.

When a decoded data block is output, the corresponding memory unit 604 can be reloaded with a new block, assuming one is available in the input buffer 602. This new block will begin to be processed when a scheduling algorithm determines that there is an available processing slot.

In one or more other embodiments, the system may be implemented using a distributed memory architecture. In contrast to the centralized architecture, where memory is shared between all the processing units, the distributed architecture has a local memory for each processing unit and an additional FIFO buffer following each processing stage. FIG. 7 shows a circular pipeline decoder having one processing stage implemented with a distributed memory architecture. New blocks are input to a first memory 704 via multiplexor 720. Processing unit 710 reads data from memory 704 to perform decoding operations. As input data is read from memory 704 for processing by processing unit 710, it is delayed by delay elements (not shown) that are matched to the delay incurred by processing unit 710, which enables the input data block and the corresponding working data produced by processing unit 710 to be written into memory 706 concurrently. In this manner, coordinated flow of data blocks and corresponding working data is achieved. The data block and any corresponding extrinsic data are read by processing unit 712 from memory 706 once written to memory 706. Having the entire block available allows the decoding operations performed by processing unit 712 to be completed in a non-interleaved order. After data is processed by the second processing unit 712, it can either be passed directly to the output of the circular pipeline, or if further processing is required to complete decoding, to a FIFO buffer 714 via multiplexor 722. Partially processed data blocks stored in FIFO buffer 714 are reinserted to memory 704 via multiplexor 720 for further processing.

The input data block flows through the circular pipeline from processing unit to processing unit alongside the working (extrinsic) data produced by the processing units. The flow of data from one processing unit to the next is a continuous process so on every clock cycle memory 704 will receive new unprocessed data input to the circular pipeline or partially processed data from the FIFO buffer 714 via multiplexor 720. The selection between new input data and partially processed data from FIFO buffer 714 may be controlled with an addressing scheme driven, for example by a simple cyclic counter, which is described in more detail with reference to FIG. 9-11 below.

The number of stages in the distributed architecture depends on application requirements and can be easily scaled to meet higher throughput values. FIG. 8 shows a two-stage circular pipeline decoder implemented with a distributed memory architecture as shown in FIG. 7. In operation, new data blocks are buffered in input buffer 806. Depending on existing flow of data being processed, buffered data blocks are input from the input buffer 806 into either the first memory unit 704 of processing stage 802 or the first memory unit 704 of processing stage 804, as described above. The data block is processed by the processing unit 710 of the one of processing stages 802 and 804 to which the data block was input. As the interleaved SISO operation is performed, the input data and the extrinsic results produced by processing unit 710 are passed to the local memory unit 706, which precedes processing unit 712. The non-interleaved SISO operation is then performed by processing unit 712 on the passed data. As the non-interleaved SISO operation is performed by processing unit 712, the data block and extrinsic data produced by processing unit 712 may be passed to output buffer 808 or buffered in FIFO buffer 714. In each embodiment, the flow of data from one processing unit to the next is a continuous process. The continuous flow of data reduces the resources and time required in transferring data at the end of each operation in other implementations. In every clock cycle, a memory unit 704 will receive data from the FIFO buffer 714 of the preceding stage or from input buffer 806. Only if there is valid data in the pipeline will a processing unit perform a useful operation, otherwise the processing unit is idle for that clock cycle.

As data is output from one of the non-interleaved processing units 712, the data can be passed to the output buffer 808 or into a FIFO buffer 714 for further processing. Only valid data is passed to the FIFO buffer. If the circular pipeline is not fully busy the FIFO buffer will not be full. The amount of space in the FIFO buffer can therefore be used as a measure of activity within the circular pipeline. For example, with reference to FIG. 8, if the FIFO buffers 714 have 3 Kbytes space, a data block of up to 3 Kbytes can be read from the input buffer 806 and added to memory 704 of processing stage 802. Assuming for purposes of illustration that a 1-byte sample is processed per cycle, it will take approximately 3 k cycles to transfer the 3 Kbyte data block from the input buffer 806 to the memory. During this time period, the FIFO buffer 714 of the preceding processing stage 804 will not output data and will gradually be filled, assuming the data is valid. In this manner, the FIFO buffer provides a mechanism to control the number of blocks within the circular pipeline at a given time.

An input control circuit (not shown) is used to control routing through multiplexors 720 and 722. The input control circuit determines when and where to insert new unprocessed data blocks in the chain. Input of data blocks and routing of partially processed data blocks may utilize a scheduling algorithm, where as soon as either FIFO becomes empty enough to accommodate the size of the incoming block, the corresponding processing stage can receive the new data block. This is referred to as a greedy scheduling algorithm as the block will be input to the array as soon as either processing stage has available memory to accommodate the new data block. In an alternative embodiment, the input control circuit may be configured to implement another scheduling algorithm to determine when to input new data blocks from input buffer 806.

In one or more embodiments, each of the memory units 704 and 706, and the FIFO buffers 714 is capable of storing a data block of the maximum size block. Therefore, the single stage two processing unit system shown in FIG. 7 would provide storage for 3 blocks, and the two-stage four processing unit system shown in FIG. 8 would be capable of storing 6 data blocks of the maximum size. In other implementations, the memory units 704 and 706, and/or the FIFO buffers 714 may be configured to buffer any number of data blocks of the maximum size.

Figure 9:
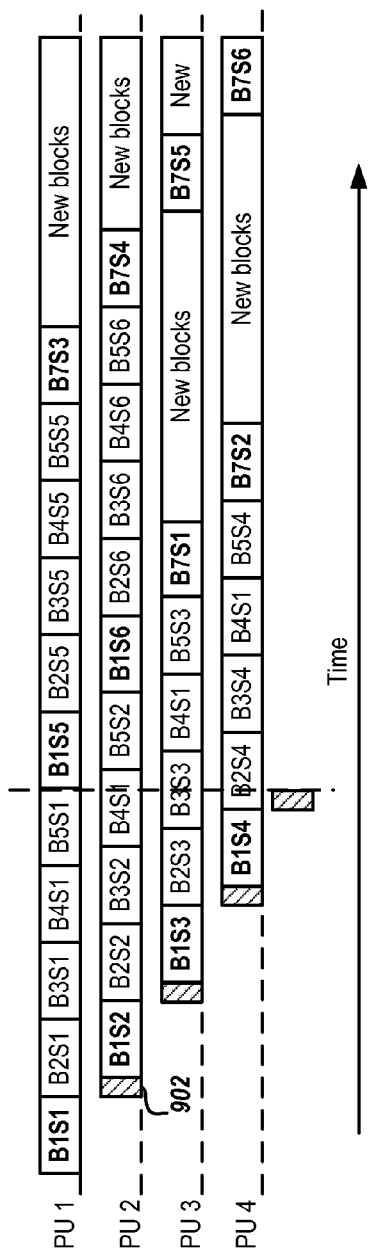
FIG. 9 illustrates data flow in an example system having four processing units arranged in a circular pipeline.

FIG. 9 illustrates data flow in an example system having four processing units arranged in a circular pipeline. In this example, each data block is processed in three decoding iterations (i.e., six SISO operations). The data block input time is approximately 4 times the pipeline delay incurred by each processing unit. The pipeline delay is represented as hatched blocks, for example, block 902. A total of 3 iterations (6 SISO operations) are completed as represented by labels B1S1 through B1S6 for data block B1. After each SISO operation, data block B1 is available to the next processing unit in the circular pipeline for continued decoding. After processing by processing unit PU4 in the pipeline, a partially decoded data block is provided to processing unit PU1 for continued decoding.

Pipeline delay 902 is incurred in performing write back between successive SISO operations of data block B1. However, following initial latency in each processing unit, the processing unit can begin processing the next data block in the pipeline during the write back period. The later blocks labelled B2 to B7 do not incur any idle cycles at all. For ease of explanation, FIG. 9 illustrates decoding completing in a total of three iterations. However, it is recognized that decoding of each block may be completed over any number of iterations.

The circular pipeline effectively eliminates idle cycles incurred by the processing units by continuously replacing blocks that have completed the final decoding iteration (retiring blocks) with new undecoded data blocks. It is possible to replace the retiring block in memory with input data, sample by sample, as the retiring block is being read for the final time for its last SISO operation. As the retiring block is being read, and the new block is being written, the new block will be ready for its first SISO operation as soon as the final SISO operation on the retiring block is complete. For example, the last SISO operation S6 is performed on block B1 in processing unit PU2. As a result, a processing slot becomes open. New data block B7 is input to processing unit PU3 for the first SISO operation.

When data blocks have a fixed data block size, such that the data block input time to a processing unit is greater than or equal to the combination of all pipeline delays in the system, only one extra data block is required to fully utilize the processing units of the circular pipeline (i.e. 5 blocks for 4 processing units). For instance, in the example shown in FIG. 9, the data block input time is 4 times the pipeline delay, and there are only four pipeline delays in the system (1 for each processing unit). When data blocks of fixed size are input, and the data block input time is less than the total of the pipeline delay in the system, more than one additional data block may be required to be available for input in order to maintain full efficiency.

Figure 10:
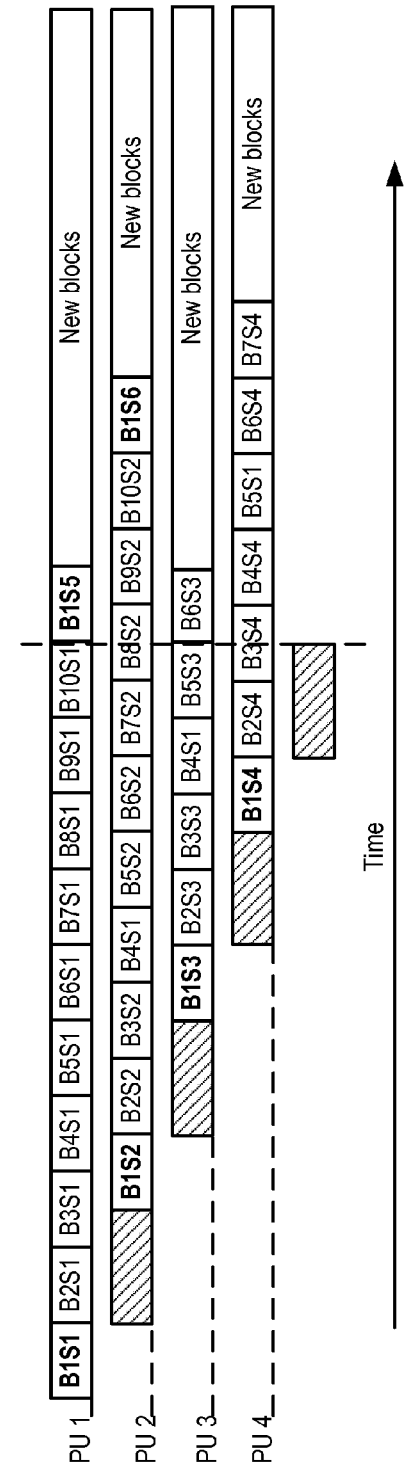
FIG. 10 illustrates data flow in a system having four processing units arranged in a circular pipeline.

FIG. 10 illustrates data flow in a system having four processing units arranged in a circular pipeline. Similar to the example shown in FIG. 9, each data block is processed in three decoding iterations (i.e., six SISO operations). In this example, the pipeline delay is 1.5 times the data block input time. As a result, a stream of 10 data blocks is required to fully occupy the pipeline such that no idle cycles are incurred. New blocks can be input to replace the retiring blocks as described above. The number of blocks required to achieve full utilization based on the relationship between the block size and the pipeline delay is given by:

Num. Blks=(Alum. PU)+ceiling((Num. PU*Pipeline Delay)/Data Block Input Time).

It is recognized that more blocks than the minimum indicated by the formula above can be submitted to the circular pipeline for processing without affecting the ability of the pipeline to maintain full throughput efficiency.

A decoder using a circular pipeline described above may be configured to have a relatively constant input and output bandwidth. It can be observed in FIG. 9 and FIG. 10 that blocks are input and output one at a time in a sequential fashion. As a result, an input buffer may only be required to be capable of buffering a single full size block at a time.

Figure 11:
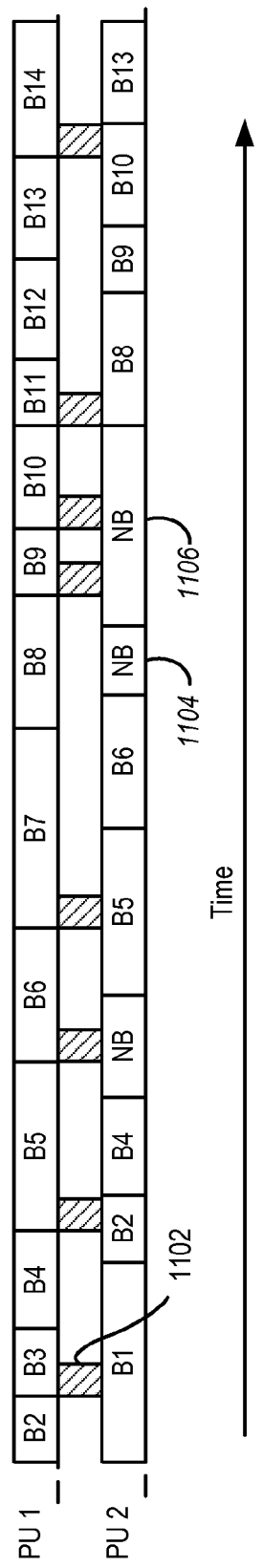
FIG. 11 illustrates data flow of variable sized data blocks in a circular pipeline of processing units.

The examples shown in FIGS. 9 and 10 illustrate data flow with data blocks having a fixed block size. In one or more embodiments, utilizing either the centralized or distributed architecture, it is also possible to operate the circular pipeline at full efficiency even with variable block sizes. FIG. 11 illustrates data flow of variable sized data blocks in a circular pipeline of processing units. For ease of explanation, this example is illustrated using only two processing units of the pipeline, where the first processing unit PU1 forwards or retires blocks and the second processing unit PU2 processes the forwarded blocks or processes a new block (NB). The size of a data block available for processing on a processing unit, and thereby the data block input time, varies at any point in time based on the current and historical block sizes. The pipeline delay required to write back and transfer a data block from one processing unit to the next is indicated by hashed blocks 1102. For simplicity, the lengths of the blocks in this example vary such that the data block input time varies between 2 and 6 times the length of the pipeline delay. The circular pipeline can be fully utilized with any data block size (up to the maximum data block size) as well. When the SISO operation on a data block in one processing unit has not completed but the next processing unit is ready to process another block, a new block may be input to the next processing unit to avoid the processing unit from becoming idle.

For example, decoding of data block B3 can complete on processing unit PU1 without inserting a NB on PU2 because by the time that PU2 completes processing of data blocks B1 and B2, data block B4 is available just in time for processing on processing unit PU2. In contrast, when data block B5 is processed on processing unit PU1, due to the increase in size of data block B5 it is not available when processing of data block B4 is completed on processing unit PU2. To avoid idle cycles, a new block is input to processing unit PU2 despite decoding of a block not having completed at this point. As another example, decoding of data block B7 completes on PU1 and data block B8 is not available at the time PU2 completes the SISO operation on data block B6. A NB 1104 is input to PU2, but the NB 1104 is small enough that processing completes before data block B8 is available from PU1. To avoid idle cycles another NB 1106 is input to PU2 once the SISO operation completes on NB 1104.

For variable block sizes, it is recognized that immediately scheduling and inputting available data blocks from the input buffer to the circular pipeline whenever possible, as illustrated in FIG. 8, may reduce the efficiency of the pipeline. The reason for this reduced performance is that immediately adding blocks to the pipeline may create a shortage of blocks in the input buffer so that when a processing unit becomes idle, a new block may not be available to fill the idle processing slot.

In one embodiment, the system has enough memory to store the number of data blocks needed to allow new blocks to be inserted where required to keep the processing units busy. For each input/output point in the circular pipeline, a certain amount of slack is required to accommodate changes in the block size between outgoing and incoming blocks as considered in the example. For example, in the architecture shown in FIG. 3, one input and one output port are provided for each processing stage (1 input and 1 output per set of 2 processing units). The overall memory requirement, M, to achieve full efficiency for variable block sizes is given by:

M=(Total system pipeline delay)+((Max. block size)* (Num. PU))+((Max. block size−Min. block size) *Num. I/O ports)

It is recognized that for a maximum block size of 5114 bits (the maximum sized block for HSPA+), neither the total systems pipeline delay nor the minimum block size are significant in relation to the maximum block size and can be disregarded. Disregarding pipeline delay and minimum block size, an overall memory requirement of 3, 6 and 12 full size blocks may be expected for systems having 2, 4 and 8 processing units respectively.

Profiling in the system model has shown that there is no memory penalty in supporting full efficiency with variable sized blocks over fixed sized blocks for systems having 2 and 4 processing units. Capacity for an additional maximum size block is desirable in an 8 processing unit system to accommodate the extra input/output points in the array. The memory requirements indicated above correspond to the theoretical worst case scenario. In practice, less memory may be required because the worst case scenario, which will never or very seldom occur, will have a negligible effect on overall efficiency.

It is recognized that the above dataflows may be achieved using a number of different memory architectures. For example, in one or more embodiments, a block's input and working (extrinsic) data could potentially physically flow through the system from processing unit to processing unit and processing stage to processing stage as SISO operations are completed. Alternatively, each processing unit can gain read/write access to a static memory location, specific to a block, in a shared memory via a crossbar switch. The later implementation is possible because SISO operations performed on a data block cannot be overlapped and only a single processing unit will ever require access to the data of a particular data block at any one time.

To allow more efficient processing of variable size data blocks when using the centralized architecture shown in FIG. 6, one or more embodiments may partition each of the memory units 604 into a number of pages that may be used for storage of data blocks. Multiple pages may be grouped together to provide storage for larger blocks. A small page size may be selected to more efficiently store small data blocks. However, as the number of pages increases, routing circuit 606 becomes more complex and/or larger to route to the larger number of memory locations.

For example, if each of the five memory units 604 shown in FIG. 6 is 5 Kbytes, the memory can be partitioned into 25×1 Kbyte pages. When the full size block of 5 Kbytes is input, 5 pages can be combined to store the block. This becomes inefficient with blocks which only partially fill pages because the remainder of the page is then unavailable to store additional blocks. This can be particularly evident for blocks whose size is slightly greater than the page size (or some multiple number of pages). For example, with a 1 Kbyte page size and for blocks of sizes slightly greater than 1 Kbyte, 2 Kbytes, 3 Kbytes, or 4 Kbytes, 2, 3, 4, or 5, pages will be required, respectively. The paged memory approach allows multiple smaller blocks to be processed to use larger blocks of idle processing time. For example, multiple smaller data block may be received by a processing stage as a single unit and processed individually. The processing stage may sequentially process each of the data block in turn. When processing is completed, the resulting data blocks may be output to the next processing stage as a single unit.

It is understood that improved efficiency achieved through memory paging may depend on the particular input sequences of block sizes. Where blocks are very small and occupy only a fraction of a single page, there are more prominent inefficiencies and a complex packing scheme may be employed to combine these input blocks into a single page and/or process them as a single unit.

Figure 12:
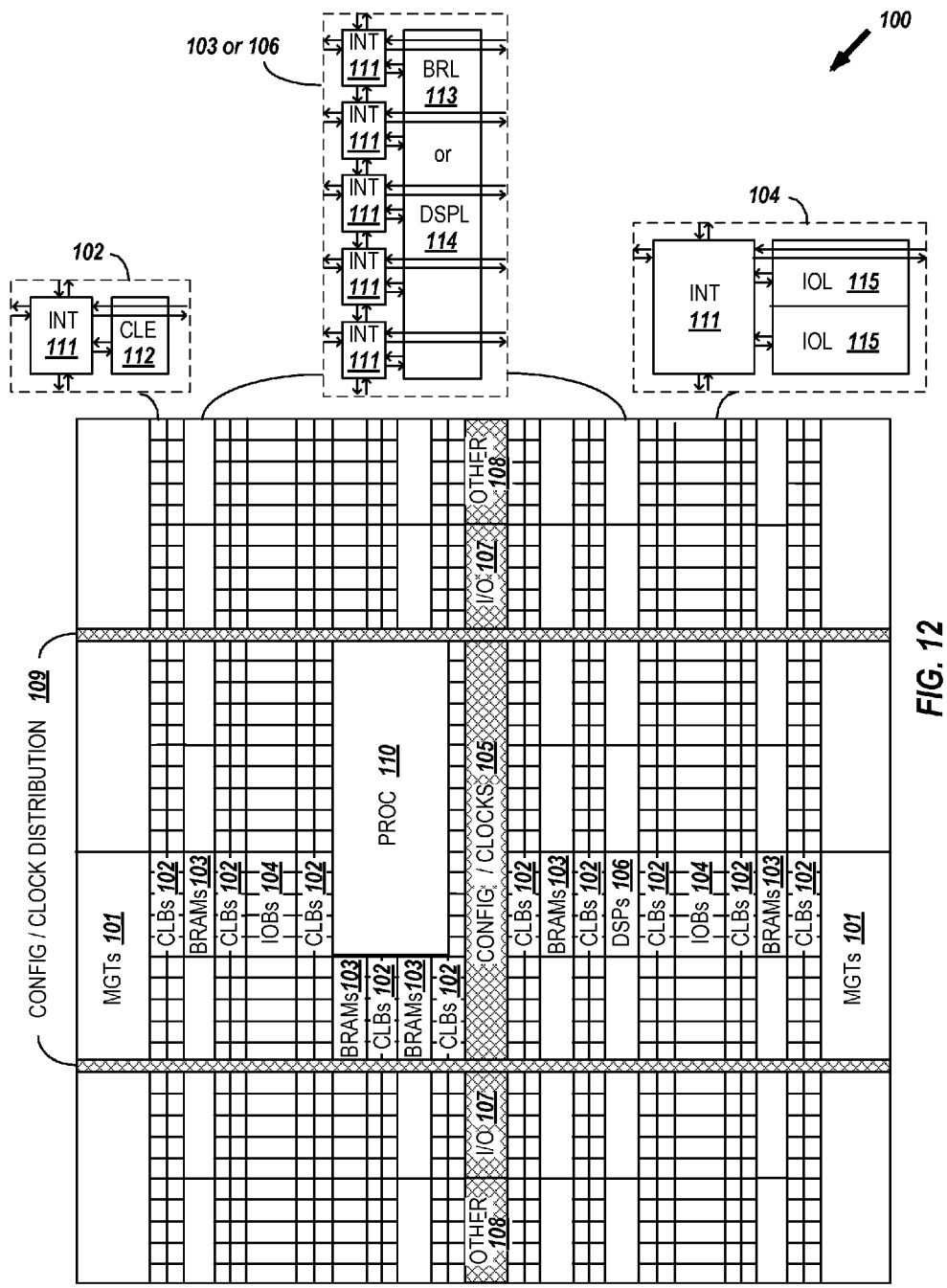
FIG. 12 shows an example programmable integrated circuit (IC) that may be configured to implement a circular pipelined processing system.

FIG. 12 shows an example programmable integrated circuit (IC) that may be configured to implement a circular pipelined processing system. The illustrated programmable IC is referred to as a Field Programmable Gate Array (FPGA). FPGAs can include several different types of programmable logic blocks in the array. For example, FIG. 12 illustrates an FPGA architecture (100) that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107), for example, e.g., clock ports, and other programmable logic 108 such as digital clock managers, analog-to-digital converters, system monitoring logic, and so forth. Some FPGAs also include dedicated processor blocks (PROC 110) and internal and external reconfiguration ports (not shown).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element INT 111 also includes the connections to and from the programmable logic element within the same tile, as shown by the examples included at the top of FIG. 12.

For example, a CLB 102 can include a configurable logic element CLE 112 that can be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element INT 111. As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 12) is used for configuration, clock, and other control logic. Horizontal areas 109 extending from this column are used to distribute the clocks and configuration signals across the breadth of the FPGA.

Some FPGAs utilizing the architecture illustrated in FIG. 12 include additional logic blocks that disrupt the regular columnar structure making up a large part of the FPGA. The additional logic blocks can be programmable blocks and/or dedicated logic. For example, the processor block PROC 110 shown in FIG. 12 spans several columns of CLBs and BRAMs.

Note that FIG. 12 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 12 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments. In addition, the processes may be provided via a variety of computer-readable storage media or delivery channels such as magnetic or optical disks or tapes, electronic storage devices, or as application services over a network.

The embodiments are thought to be applicable to a variety of systems for iterative block based data processing. Other aspects and embodiments will be apparent to those skilled in the art from consideration of the specification. The embodiments may be implemented as one or more processors configured to execute software, as an application specific integrated circuit (ASIC), or as a logic on a programmable logic IC. It is intended that the specification and illustrated embodiments be considered as examples only, with a true scope of the embodiments being indicated by the following claims.

What is claimed is:

1. A circular pipeline processing system, comprising:
   a plurality of processing stages, each processing stage including:
   at least one processing circuit configured to perform one processing iteration on a first block of data, the processing iteration including:

performing a first set of soft-input-soft-output (SISO) decoding operations on the first block of data to produce an intermediate block of data; and performing a second set of SISO decoding operations on the intermediate data block to complete the one decoding iteration;

a memory buffer; and wherein the plurality of processing stages is configured to operate in a circular pipeline of identical processing stages, each processing stage being configured to:

output a fully processed data block in response to completing a final processing iteration, and otherwise, store a partially processed data block in the memory buffer of the processing stage;

select between an unprocessed data block and a partially processed data block from the memory buffer of a preceding processing stage, based on availability of storage sufficient for an unprocessed data block and availability of a partially processed data block; and process the selected data block.

2. The system of claim 1, wherein each processing stage is further configured to select the unprocessed data block in response to the memory buffer of the preceding processing stage having sufficient available storage to store an additional data block, and otherwise select the partially processed data block from the memory buffer of the preceding processing stage.

3. The system of claim 1, wherein each processing stage is configured to select the partially processed data block from the memory buffer of the preceding processing stage in response to the partially processed data block being available in the respective memory buffer of the preceding processing stage in the circular pipeline, and otherwise select the unprocessed data block.

4. The system of claim 1, further comprising:

an input buffer circuit configured to: buffer data blocks received at an input of the system; and a routing circuit configured to input a data block to a processing stage from either the input buffer or from the memory buffer of the preceding processing stage.

5. The system of claim 1, further comprising:

an output buffer circuit configured to buffer and output the fully processed data blocks from the system; and a routing circuit configured to:

in response to the at least one processing circuit completing a final processing iteration to produce a fully processed data block, couple the at least one processing circuit to the output buffer circuit, and otherwise, couple the at least one processing circuit to a memory buffer of the processing stage.

6. A decoder, comprising:

a circular pipeline of processing units arranged in N processing stages, where N>1, each processing stage of the circular pipeline including:

a first memory unit configured to receive and store data blocks input to the processing stage;

a first processing unit coupled to the first memory unit and configured to perform a first set of soft-input-soft-output (SISO) decoding operations on a block of data retrieved from the first memory unit to produce an intermediate block of data;

a second memory unit coupled to the first processing unit and configured to receive and store the intermediate block of data; and a second processing unit coupled to the second memory unit and configured to perform a second set of SISO decoding operations using the intermediate block of data retrieved from the second memory unit, to complete one decoding iteration;

an input buffer circuit;

a memory buffer in each processing stage;

wherein:

each second processing unit in each processing stage is configured to output a decoded data block in response to completing a final processing iteration, and otherwise, store a partially decoded data block in the memory buffer of the processing stage; and each first memory unit is configured to:

select between a new data block from the input buffer circuit and a partially decoded data block from the memory buffer of a preceding processing stage based on one or more of availability of memory sufficient for storage of an unprocessed data block or availability of a partially processed data block; and receive the selected data block, wherein each processing stage includes a routing circuit configured to, in response to a control signal, couple the first memory unit of each processing stage to the memory buffer of the preceding processing stage in the circular pipeline or couple the first memory to the input memory buffer.

7. The decoder of claim 6, wherein each first memory unit of a processing stage is configured to select the new data block from the input buffer circuit in response to the memory buffer of the preceding processing stage having sufficient available storage to store one or more additional data blocks.

8. The decoder of claim 6, wherein each first memory unit is configured to select the partially decoded data block in response to the partially decoded data block being available in the respective memory buffer of the preceding processing stage in the circular pipeline.

9. The decoder of claim 6, wherein the routing circuit is configured to couple each second processing unit to an output buffer of the decoder in response to said second processing unit completing the final processing iteration, and otherwise, couple the second processing unit to the memory buffer of the processing stage.

10. A decoder, comprising:

a memory arrangement configured for storage of a plurality of data blocks in a plurality of memory units;

a circular pipeline including a plurality of processing stages, each processing stage including:

a first processing unit coupled to the memory arrangement and configured to perform a first set of soft-input-soft-output (SISO) decoding operations on a block of data retrieved from one of the plurality of memory units to produce an intermediate block of data, and store the intermediate block of data in the one memory unit; and a second processing unit coupled to the memory arrangement and configured to:

perform a second set of SISO decoding operations using the intermediate block of data retrieved from the one memory unit to complete one decoding iteration; and output a decoded data block in response to completing a final processing iteration, and otherwise, store a partially decoded data block in the one memory unit; and wherein the first processing unit is further configured to process a new block of data of the plurality of data blocks retrieved from another one of the memory units in response to a partially decoded data block from a second processing unit of a preceding processing stage in the circular pipeline being unavailable in the memory arrangement; and a routing circuit configured to couple each processing unit to respective memory units of the memory arrangement in a manner causing the plurality of processing stages to operate as a circular pipeline.

11. The decoder of claim 10, wherein the decoder is configured to process variable size data blocks.

12. The decoder of claim 10, wherein each of the plurality of memory units includes a number of partitions that are concurrently accessible.

13. The decoder of claim 12, wherein two or more of the plurality of data blocks are stored in respective ones of the number of partitions of one of the plurality of memory units.

14. The decoder of claim 13, wherein the first and second processing units of each stage in the circular pipeline are configured to receive the two or more of the plurality of data blocks as a single unit and individually process the two or more of the plurality of data blocks.

15. The decoder of claim 10, wherein in response to the first processing unit of a stage being ready to accept a data block and a partially decoded data block being available from the preceding processing stage in the circular pipeline of processing stages, the routing circuit is configured to couple the first processing unit to one of the memory units containing a partially decoded data block from the preceding processing stage in the circular pipeline.

16. The decoder of claim 10, wherein in response to the first processing unit of a stage being ready to accept a data block and a partially decoded data block not being available from the preceding processing stage in the circular pipeline of processing stages, the routing circuit is configured to couple said first processing unit to one of the memory units of the memory arrangement containing a new data block of the plurality of data blocks.

17. The decoder of claim 10, further comprising an input buffer circuit coupled to the memory arrangement and configured to:
 buffer input blocks received at an input of the decoder; and
 store buffered input blocks in the memory arrangement as blocks of memory become available.

\* \* \* \* \*